(12) United States Patent
Alfano et al.

(10) Patent No.: US 8,861,229 B2
(45) Date of Patent: Oct. 14, 2014

(54) ISOLATOR CIRCUIT INCLUDING A VOLTAGE REGULATOR

(75) Inventors: Donald E. Alfano, Round Rock, TX (US); Timothy J. Dupuis, Austin, TX (US); Zhiwei Dong, Austin, TX (US); Brett E. Etter, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 1433 days.

(21) Appl. No.: 12/129,039

(22) Filed: May 29, 2008

(65) Prior Publication Data

US 2008/0315925 A1 Dec. 25, 2008

Related U.S. Application Data

(60) Provisional application No. 60/946,064, filed on Jun. 25, 2007.

(51) Int. Cl.
*H02M 3/335* (2006.01)
*H02M 3/156* (2006.01)

(52) U.S. Cl.
USPC .................................. 363/16; 323/299

(58) Field of Classification Search
USPC ............. 363/18, 19, 16; 323/276, 280, 299; 455/572–574
See application file for complete search history.

(56) References Cited

U.S. PATENT DOCUMENTS

| | | | |
|---|---|---|---|
| 5,894,215 A * | 4/1999 | Yazdy et al. | 323/282 |
| 6,262,600 B1 | 7/2001 | Haigh et al. | |
| 6,525,566 B2 | 2/2003 | Haigh et al. | |
| 6,873,065 B2 | 3/2005 | Haigh et al. | |
| 6,903,578 B2 | 6/2005 | Haigh et al. | |
| 6,922,080 B2 | 7/2005 | Haigh et al. | |
| 7,493,505 B2 * | 2/2009 | Leung | 713/323 |
| 7,598,716 B2 * | 10/2009 | Schlueter et al. | 323/280 |
| 2005/0269657 A1 | 12/2005 | Dupuis | |
| 2005/0271147 A1 | 12/2005 | Dupuis | |
| 2005/0271148 A1 | 12/2005 | Dupuis | |
| 2005/0271149 A1 | 12/2005 | Dupuis | |
| 2005/0272378 A1 | 12/2005 | Dupuis | |
| 2007/0040579 A1 * | 2/2007 | Jang | 326/81 |
| 2007/0126372 A1 * | 6/2007 | Huang et al. | 315/291 |

FOREIGN PATENT DOCUMENTS

WO   WO2005122423 A2   12/2005

OTHER PUBLICATIONS

Agilent (Hewlett-Packard), "2.0 Amp Output Current IGBT Gate Drive Optocoupler," HCPL-3120 Technical Data Sheet, <http://www.datasheetcatalog.com>, pp. 1-182-1-196, (prior to May 29, 2008).
Toshiba, "TLP250(INV)," Toshiba Photocoupler, GaAlAs IRED & Photo-IC Data Sheet, <http://www.datasheetcatalog.com>, pp. 1-6, Jun. 27, 2002.

* cited by examiner

*Primary Examiner* — Jessica Han
(74) *Attorney, Agent, or Firm* — Abel Law Group, LLP

(57) ABSTRACT

An apparatus includes a regulator circuit that generates a voltage in response to an input current being supplied to an input terminal and functional circuitry, powered by the voltage generated by the regulator circuit. The functional circuitry, e.g., an oscillator, generates a signal using the generated voltage, the signal indicative that the current is being supplied to the apparatus. The signal can be provided over an isolation link to provide a control signal for controlling a high voltage driver circuit.

30 Claims, 8 Drawing Sheets

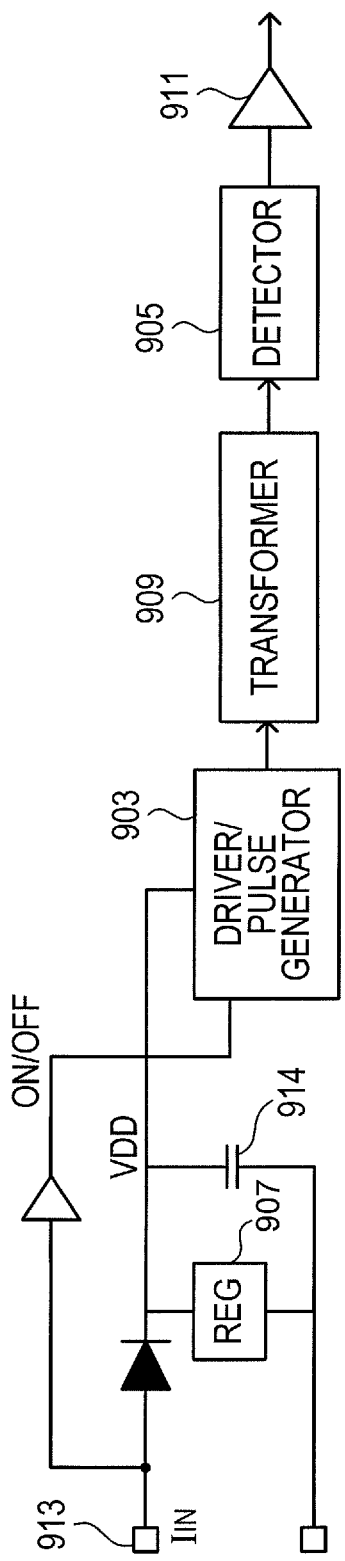
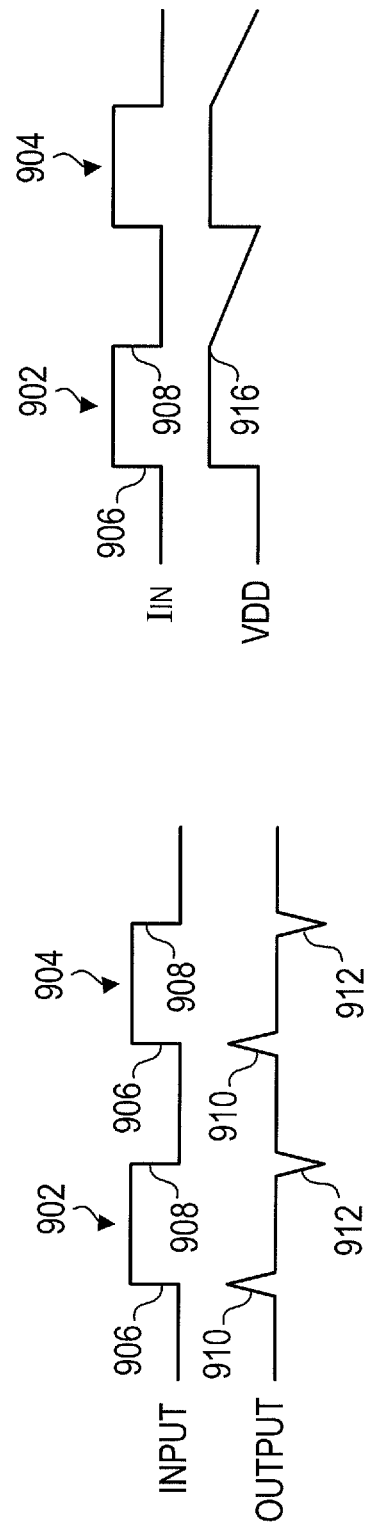
FIG. 9A
FIG. 9B
FIG. 9C

ISOLATOR CIRCUIT INCLUDING A VOLTAGE REGULATOR

CROSS-REFERENCE TO RELATED APPLICATION(S)

This application claims benefit under 35 U.S.C. §119(e) of U.S. Provisional Application No. 60/946,064, filed Jun. 25, 2007, entitled "Isolator Circuit Including a Voltage Regulator," and naming as inventors Donald E. Alfano, Timothy J. Dupuis, Zhiwei Dong, and Brett E. Etter, which application is incorporated by reference herein in its entirety.

BACKGROUND

1. Field of the Invention

This invention relates to isolation technology and more particularly to isolators providing isolation between a control signal and a driver circuit.

2. Description of the Related Art

Opto-isolators have been used with driver circuits to provide isolation between the control signal and the drivers. An example of a traditional opto-isolator is shown in FIG. 1. When a current on node 101 is applied to light emitting diode (LED) 103, the diode emits light which is received by photo transistor 105. FIG. 1 also shows a high voltage driver 107. The voltage of the high voltage driver is typically 12-25 volts, but may be higher, depending on the application. When the current is supplied on node 101, the driver 107 turns on.

One problem with the opto-isolators shown in FIG. 1 is that the output of the diode is dependent on the strength of the current. That is, the harder the diode is driven, the stronger the diode output. Thus, switching characteristics may be undesirable. In addition, opto-drivers may be susceptible to common mode input transients and so an external resistor 111 may be chosen to overdrive the LED 103 to keep it on when a common mode transient occurs during an output high state. However, that causes less efficiency during operation when the control current is turned off via control transistor 112 due to the dissipation through external resistor 111.

Thus, it would be desirable to provide improved isolation technology with greater immunity to input common mode transients and improved operating efficiency.

SUMMARY

Accordingly, in one embodiment an apparatus is provided that includes a first circuit including a regulator circuit configured to generate a voltage in response to an input current being supplied to an input terminal. Functional circuitry, powered by the generated voltage, is configured to generate a signal using the generated voltage, the signal indicative of the input current being supplied to the apparatus. An isolation circuit is responsive to the signal to supply a representation of the signal across an isolation barrier to an isolation link.

In an embodiment, the input current is indicative of a control signal for a driver circuit electrically isolated from the input current by the isolation barrier.

An embodiment includes a first unit that includes the first circuit, the functional circuitry and the isolation circuit. A second unit includes a receiver circuit and a high voltage driver circuit. The first unit and the second unit are coupled by the isolation link, and the representation of the signal is provided to the second unit over the isolation link, the representation of the signal indicative of a control signal for the high voltage driver circuit.

In an embodiment, the isolation circuit includes a transformer, and the transmitter circuit, when supplied with the voltage, is responsive to supply the signal into a primary winding of the transformer to cause energy to be coupled into a secondary winding of the transformer, the isolation barrier being disposed between the primary and secondary windings.

In an embodiment, when no current is supplied to the input terminal, substantially zero voltage is generated by the regulator circuit and the signal is not supplied by the functional circuitry.

In an embodiment, the first circuit is configured to be resistant to electrostatic discharge. In an embodiment, the functional circuitry comprises an oscillator circuit configured to supply the signal.

In an embodiment, a method is provided that includes receiving an input current on an input terminal; generating in a regulator circuit a supply voltage for functional circuitry using the input current; generating a signal in the functional circuitry indicative of presence of the input current using the supply voltage; and supplying a representation of the signal across a voltage isolation barrier to an isolation link.

In an embodiment, supplying the representation of the signal across the voltage isolation barrier comprises supplying the signal into a primary winding of a transformer to cause energy to be coupled into a secondary winding of the transformer, the primary and secondary windings being separated by the voltage isolation barrier.

In an embodiment, the method includes providing an electrostatic static discharge resistance as part of the regulator circuit.

BRIEF DESCRIPTION OF THE DRAWINGS

The present invention may be better understood, and its numerous objects, features, and advantages made apparent to those skilled in the art by referencing the accompanying drawings.

FIG. 9A illustrates an alternative embodiment of the invention.

FIG. 9B illustrates operation of the embodiment in FIG. 9A.

FIG. 9C illustrates VDD in the embodiment of FIG. 9A.

The use of the same reference symbols in different drawings indicates similar or identical items.

DESCRIPTION OF THE PREFERRED EMBODIMENT(S)

Figure 1:
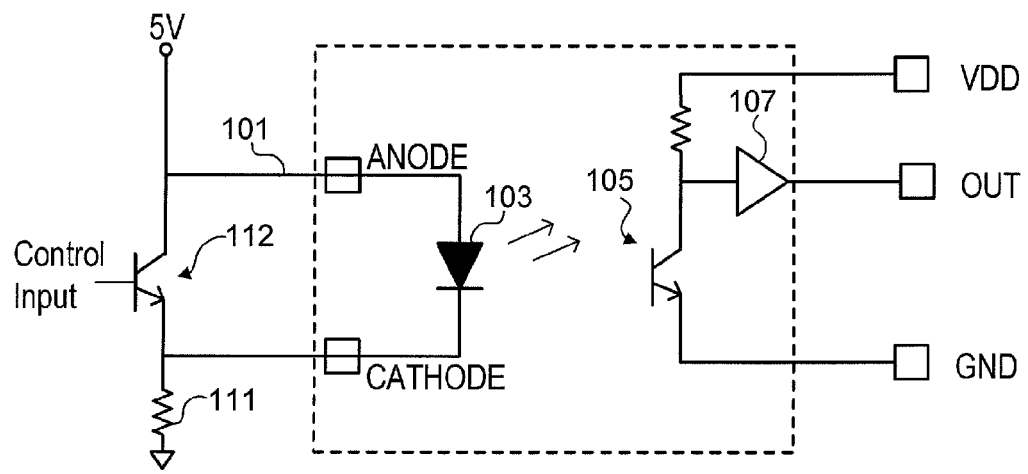
FIG. 1 illustrates a prior art opto-isolator with a high voltage driver.
Figure 2A:
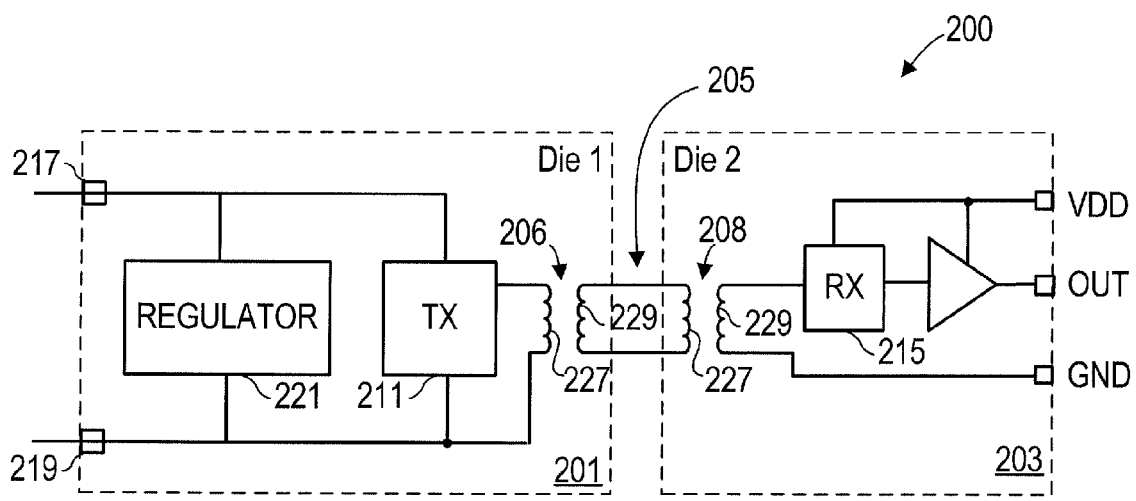
FIG. 2A illustrates an isolator according to an embodiment of the invention.

Referring to FIG. 2A, illustrated is an embodiment of an improved isolator that can be used, e.g., in place of the prior art isolator illustrated in FIG. 1. In the embodiment illustrated in FIG. 2A, the isolation link is implemented by providing two dies 201 and 203 between which is a link 205. Each die 201 and 203 includes a transformer 206 and 208, respectively. Die 201 includes transmit circuitry 211 coupled to transformer 206 and die 203 includes receive circuitry 215 coupled to transformer 208. The signals to be transmitted are generated within the transmit circuitry 211 on one side of the isolation link, and the signals are transmitted between the dies utilizing the transformers 206 and 208 in each die and the magnetic coupling effect therebetween. In particular, transmit circuitry 211 drives the transformer 206 with a signal such that energy is coupled from the primary to the secondary thereof. That allows energy to be transmitted on transmission lines 205 that couple the transformers 206 and 208 together.

Each of the transformers is comprised of a primary 227 and a secondary 229. The primary 227 is driven with the input signal and energy associated therewith is coupled across a high voltage isolation barrier from the primary 227 to the secondary 229 and onto the transmission line 205. Energy from the transmission line is coupled from the primary winding 229 to secondary winding 227 across another high voltage isolation barrier in die 203 separating the primary and the secondary windings. The transmit circuitry 211 and receive circuitry 215 and the transformers 206 and 208 are fabricated on integrated circuits such that the primary 227 and secondary windings 229 are both formed utilizing conventional processing techniques on, e.g., separate metal layers of the integrated circuits using available conductive layers that may be shared with the transmit and receive circuits, with the high voltage barrier being formed by the separation of the conductive layers with non-conductive material formed therebetween in accordance with conventional processing techniques. In an exemplary embodiment, the high voltage barrier can provide voltage isolation of several thousand volts, e.g., up to around five thousand volts.

The die 201 includes two pins 217 and 219 that correspond to the anode and cathode in FIG. 1. However, rather than rely on a photo-diode, the isolation approach shown in FIG. 2A and described further herein provides improved performance using the transformers described above. However, as one aspect of the invention is to be a replacement for prior art implementations such as shown in FIG. 1, where photo-diodes are utilized, there may be no other power available for operation of the transmitter 211. Accordingly, the embodiment illustrated in FIG. 2A utilizes a regulator 221 to generate a voltage (VDD) for use by the transmitter circuit 211. When current is supplied to input terminal 217, the regulator 221 sets the voltage VDD, which is used by the transmitter 211 to drive a signal into the primary 227. In an embodiment, the transmitter circuit includes an oscillator circuit. In an embodiment, the only time the oscillator circuit provides an oscillating signal is when VDD is present. That means, the only time the oscillating signal is present is when current is supplied to input terminal 217.

Figure 2B:
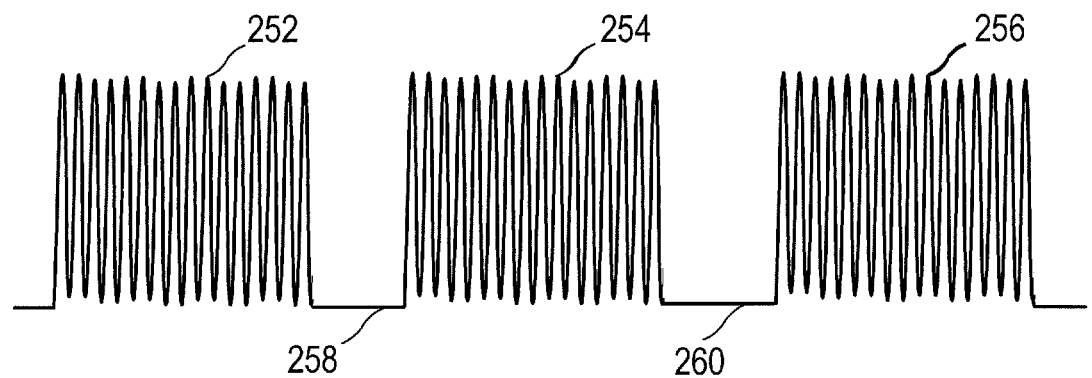
FIG. 2B illustrates an exemplary transmitted signal in the embodiment of FIG. 2A.

Once the signals are received at die 203, the receive circuitry 215 detects the transmission from the first die and based on that transmission, turns on the driver 223. In an embodiment, the transmitter generates an oscillating signal when the current is present. In embodiments, the transmitter may use frequency modulation techniques or amplitude modulation techniques for the transmitted signal. An exemplary waveform driven into the primary winding 227 of transformer 206 is shown in FIG. 2B. As shown by the waveform, the transmitted circuit may be an oscillating signal. When the current flows into the regulator circuit, the oscillator generates a waveform at 252, 254, and 256. When no current flows into the regulator, at 258 and 260, no oscillating signal is generated.

Figure 2C:
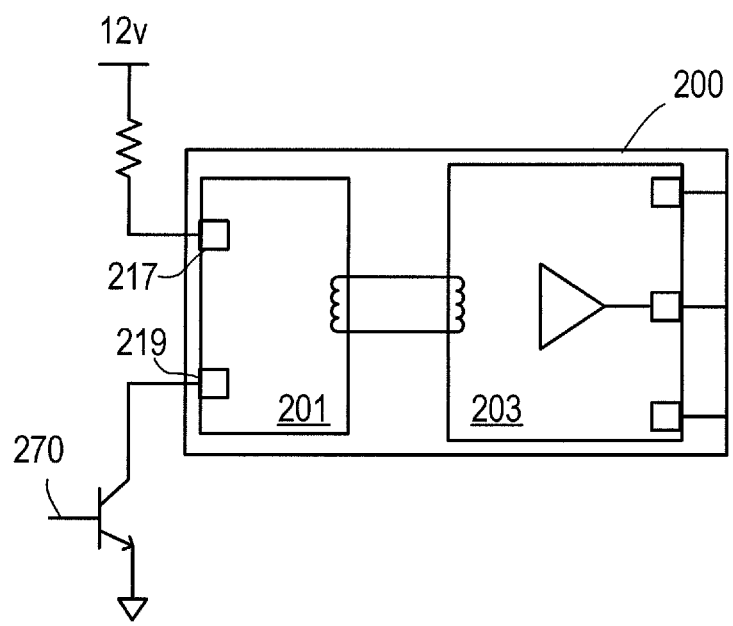
FIG. 2C illustrates a high level diagram of an isolator and high voltage driver according to an embodiment of the invention.

FIG. 2C illustrates a high level diagram of the isolator-driver according to an embodiment of the invention. As can be seen, a control signal is provided on node 270 to control the current. Note that when the control signal is off, no current flows, making the implementation more power efficient.

Figure 3:
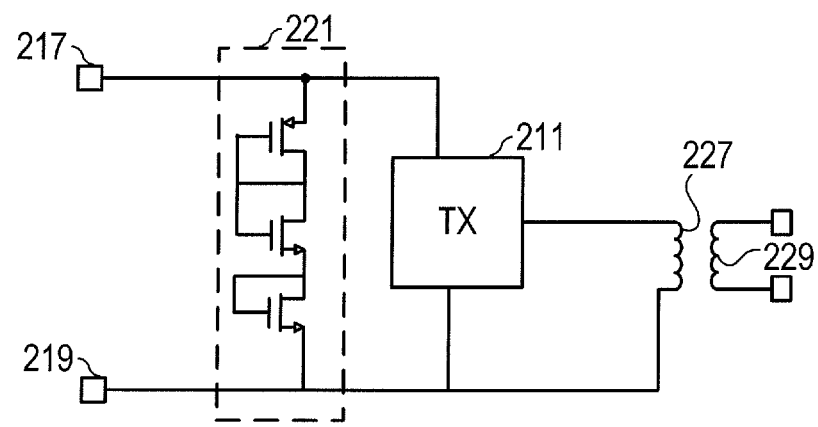
FIG. 3 illustrates an embodiment including a shunt regulator according to an embodiment of the invention.
Figure 4:
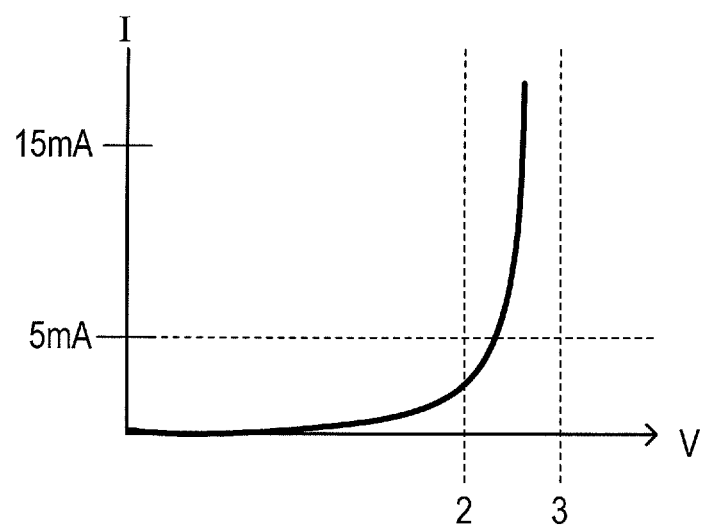
FIG. 4 illustrates an exemplary curve illustrating the current/voltage relationships for the regulator of FIG. 3.

Referring to FIG. 3, an exemplary regulator circuit 221 is shown. The regulator circuit includes diode connected metal oxide semiconductor (MOS) transistors. As shown by the graph in FIG. 4, the voltage is relatively stable (e.g., ranges between 2 and 3 volts) over a relatively large swing of current input on terminal 217. For example, in an embodiment, the voltage provided by the regulator for an input current of 5 mA is 2.2 volts and the voltage at 15 mA is 2.6 volts. In the embodiment illustrated in FIGS. 2 and 3, no other voltage supply apart from VDD provided by the regulator is provided to power the transmit circuitry. Note that the graph shown is exemplary and such factors as the specific requirements of the system, process technology, and available input current will determine appropriate design parameters for the regulator. Whenever the input current is present, VDD is provided to the transmitter circuit 211, which drives a signal onto primary 227, which in turn is coupled to secondary 229. By providing the regulator circuit, a replacement for the photo-diode approach over the prior art may be provided.

Figure 5:
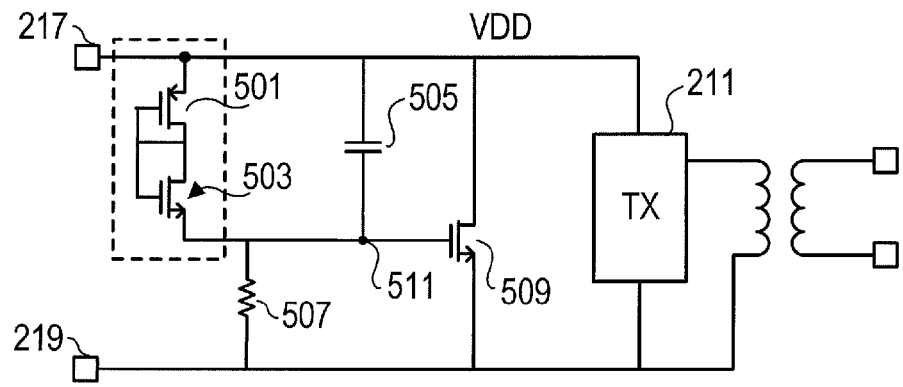
FIG. 5 illustrates an embodiment in which the regulator and ESD protection circuitry are included.

In addition to providing a regulator, another design goal is to provide a circuit that is resistant to electrostatic discharge (ESD). As is known in the art, ESD, which can be several thousand volts, can lead to damage of electronic components. Accordingly, it is desirable to provide protection circuits on input terminals that make the device resistant to ESD problems. Referring to FIG. 5, an embodiment of the invention includes combined ESD protection and regulation. The regulator includes the diode connected transistors 501 and 503 between the input terminal and the node 511. In addition, the capacitor 505 and resistor 507 function as part of the ESD circuit providing ESD protection on input terminal 217. Transistor 509, preferably a large transistor, turns on sinking excess current if the voltage on node 511 gets too high. Combining the regulation and ESD functions can be advantageous. For example, the presence of the diodes 501 and 503 allow the resistor 507 to be much smaller than in traditional ESD circuits. For example, the size of resistor 507 can be on the order of 1K ohm, as opposed to 300K ohms that would be required absent the diodes. In addition, a wider current range may be achieved with a voltage range of 2.2 to 2.6 volts. For example, a regulator incorporating ESD in the manner described herein can accommodate a current range of approximately 4 mA to approximately 50 mA. At 4 mA less power is consumed (as compared to, e.g., 5 mA), while an upper range of approximately 50 mA allows for a wider working current range as compared to, e.g., an upper range limit of 15 mA.

Figure 6A:
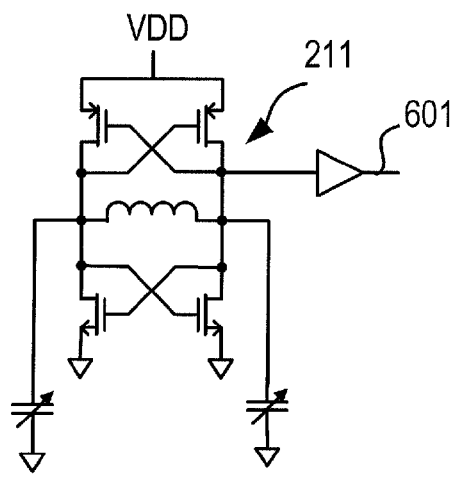
FIG. 6A illustrates an exemplary oscillator that may be utilized for the transmitter of FIG. 5.

Referring to FIG. 6A, an exemplary oscillator circuit is shown that may be used to form the transmitter circuit. When the regulator supplies a voltage for the transmitter circuit, an oscillation signal 601 is driven to the primary winding of the transformer 206. In an exemplary embodiment, a 2 GHz oscillator is utilized. Other types of oscillators and other oscillation frequencies may, of course, be utilized.

Figure 6B:
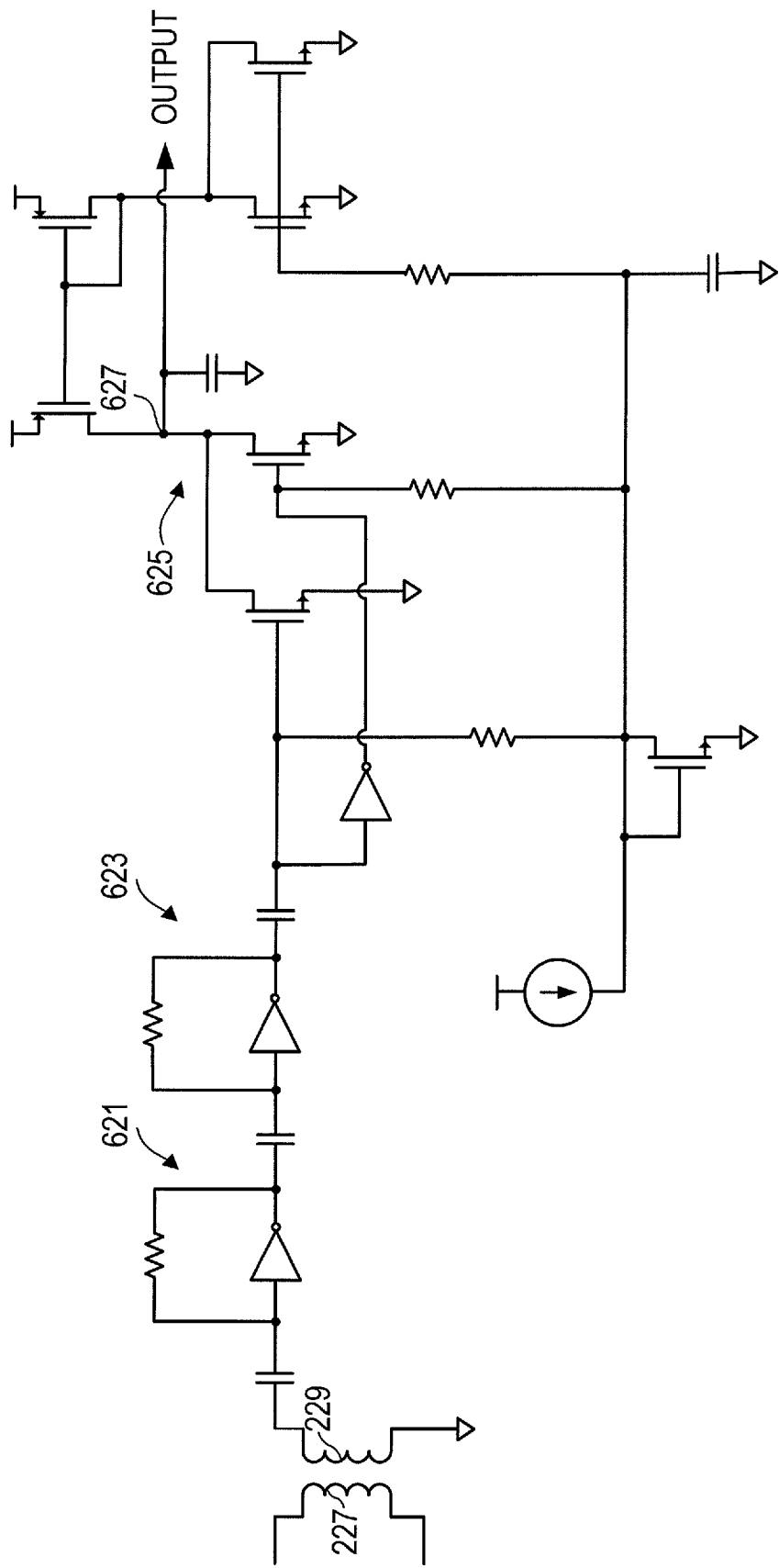
FIG. 6B illustrates a high level diagram of a receive circuit according to an embodiment of the invention.

In embodiments in which an oscillating signal is transmitted, any circuit that can detect the presence of an oscillating signal can be used in the receive circuitry. One such example is shown in FIG. 6B. The receiver circuit in FIG. 6B includes amplifier stages 621 and 623 and detector circuit 625 that detects the presence of the oscillating signal and provides an output at node 627 equal to VDD in the absence of the oscillating signal and a low voltage when the oscillating signal is present. Of course, many other receiver circuits may be implemented, depending upon the nature of the transmitted signal and specific system requirements. Additional description of various transmit and receive circuits that may be used in various embodiments of the invention are provided in the applications, "On Chip Transformer Isolator," filed Jun. 3, 2004, Ser. No. 10/860,519, Publication No. 2005/0269657, naming Timothy Dupuis as inventor; and "RF Isolator with Differential Input/Output," application Ser. No. 11/020,977, naming Timothy Dupuis as inventor, filed Dec. 22, 2004, published on Dec. 8, 2005 as Publication No. 2005/0271148 A1, which applications are incorporated herein by reference in their entirety.

Figure 7:
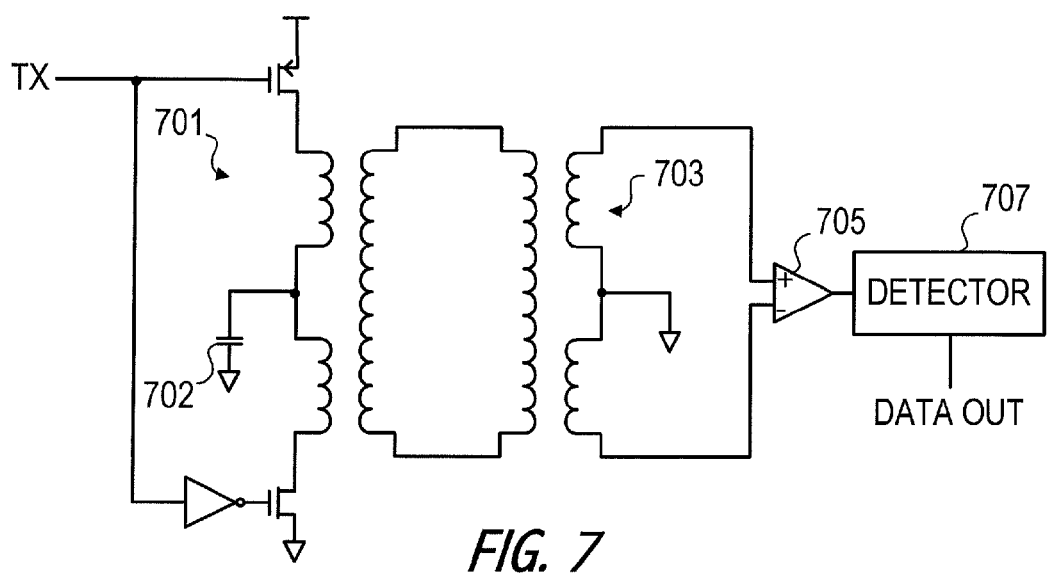
FIG. 7 illustrates a center-tapped transformer embodiment that provides better performance in the presence of common mode interference.

While the single-ended isolation link shown in, e.g., FIG. 2A, may be suitable for some applications, another embodiment utilizes a transformer based isolator with differential inputs and outputs. Such a differential embodiment is illustrated in FIG. 7 and provides improved performance in the presence of common mode interference. That is accomplished by use of the center tapped transformer 701 connected through a capacitor 702 to ground. The center tap transformer 703 on receive side is grounded. The received signal is provided to a differential amplifier. Additional details on differential embodiments can be found in the application Ser. No. 11/020,977 entitled "RF Isolator with Differential Input/Output," naming Timothy Dupuis as inventor, filed Dec. 22, 2004, published on Dec. 8, 2005 as Publication No. 2005/0271148, which application is incorporated herein by reference in its entirety.

Use of the isolation techniques described above allows the isolator to provide switching characteristics that are substantially independent of the strength of the current. In addition, by using transformer isolators, the susceptibility of opto-drivers to common mode input transients is avoided. Additionally, improved efficiency may be provided when the control current is turned off in view of the absence of resistor 111 (FIG. 1). Further, faster signal transfer, e.g., approximately 100 megabits per second, can be achieved and less power is consumed than in traditional opto-isolator implementations, assuming 5 mA of input current and a 2.3 V regulated supply voltage.

While the specific transformer isolation techniques described above may be used in various embodiments of the invention, the invention is not restricted to those particular isolation techniques. In fact, many different isolation techniques may utilize the regulator approach and the regulator/ESD approach described herein.

Figure 8:
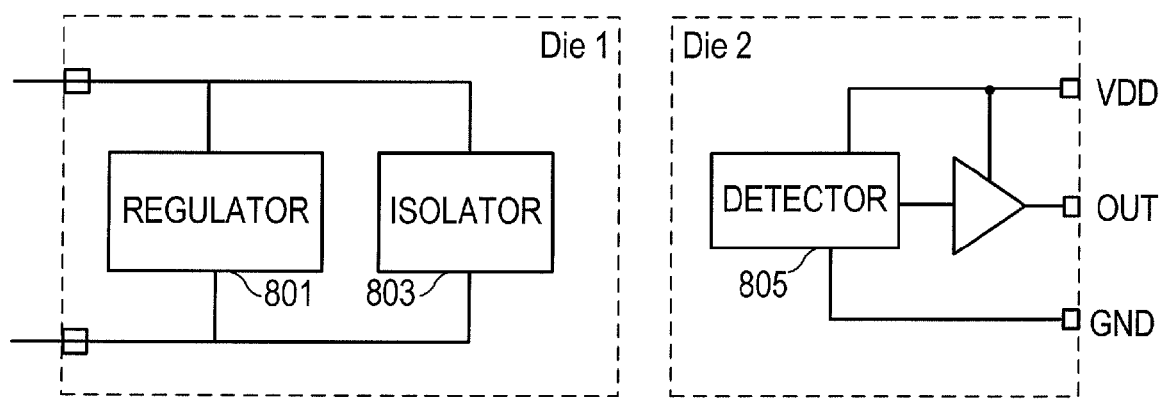
FIG. 8 illustrates an embodiment of the invention using a regulator to provide power for implementing isolation.

For example, as shown in FIG. 8, a regulator 801 may be utilized to power an isolation block 803 that supplies a signal that can be detected by detector block 805. Many different isolation approaches may be utilized to implement the isolation and detection.

For example, as shown in FIG. 9A, a transformer 909 may be used to provide isolation between driver/pulse generator 903 and a detector 905. The driver is powered by regulator 907. The driver/pulse generator 903 generates pulses indicative of the presence or absence of the input current on node 913. Between the driver/pulse generator 903 and detector 905 is a transformer 909. The transformer 909 provides for electromagnetic transmission of information from the driver/pulse generator 903 to the detector 905. The driver/pulse generator 903 generates a pulse output in response to the input as illustrated in FIG. 9B. The input is shown as a waveform with portions 902 and 904 that correspond to current being supplied to node 913. Each portion 902, 904 has a rising edge 906 and a falling edge 908. In response to a rising edge 906, the output of the driver/pulse generator 903 generates a positive pulse 910. The falling edge 908 of the waveform generates a negative pulse 912. Those positive and negative pulses are supplied to transformer 909 and cause induced signals that are detected by detector 905 and used to drive driver 911.

In order to supply power for the negative going pulse in the embodiment shown in FIG. 9A, a capacitor 914 (which may be implemented off the die) can be used to store power for use when the current on node 913 stops. As shown in FIG. 9C, the capacitor gradually discharges at 916 supplying sufficient VDD to generate the pulse at 912 (FIG. 9B). The discharge rate of the capacitor is of course exemplary and may be faster or slower depending on the particular implementation.

Figure 10:
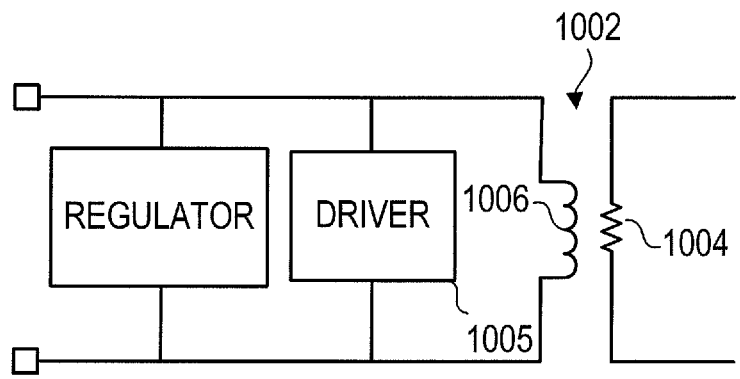
FIG. 10 illustrates another embodiment in which a magneto resistive coupler is utilized for isolation.

Referring now to FIG. 10, another isolation approach makes use of a magneto resistive coupler. The magneto resistive coupler 1002 includes a resistor 1004 and associated transformer 1006. The resistor 1004 has a resistance value that changes responsive to the magnetic flux about the resistor. A detector (not shown) utilizes a Wheatstone bridge to detect the magnetic flux of the resistor and determined transmitted data.

Figure 11A:
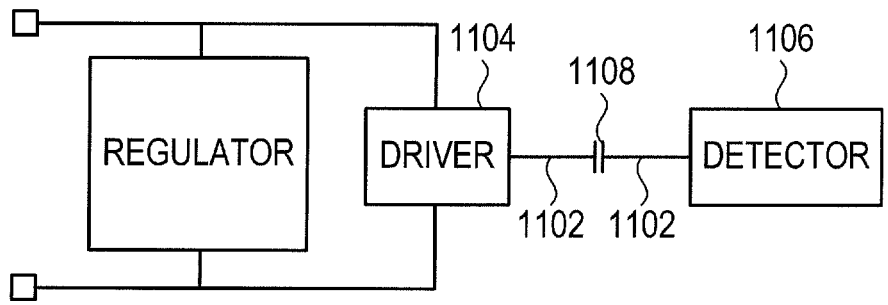
FIG. 11A illustrates a capacitively coupled isolation embodiment of the invention.
Figure 11B:
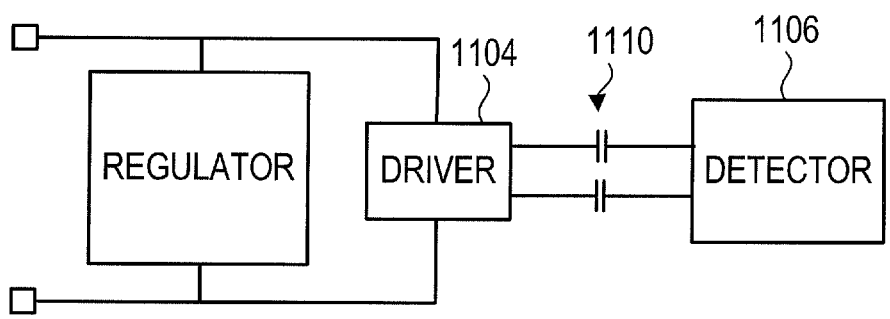
FIG. 11B illustrates a capacitive isolation implementation using differential capacitive coupling.

Still another approach to isolation between a driver 1104 and a detector 1106 is illustrated in FIG. 11A. The driver 1104 and the detector 1106 are isolated on opposite sides of a link 1102 by a capacitor 1108. The capacitor 1108 capacitively couples the driver 1104 and detector 1106 together to achieve a level of isolation. In FIG. 11B, a capacitive isolation implementation using differential capacitive coupling is illustrated.

Thus, while one isolation technique may use the transformer isolation technique shown, e.g., in FIGS. 2 and 7, many other approaches are possible that use a regulator to provide a voltage to the driver or transmitter circuit to generate a signal that can be coupled to the other side of an isolation barrier.

Although various embodiments have been described in detail, it should be understood that various changes, substitutions and alterations can be made therein without departing from the scope of the invention as defined by the appended claims.

What is claimed is:
1. An apparatus comprising:
a first circuit including a regulator circuit configured to generate a voltage on a first power supply node in response to an input current being supplied to an input terminal coupled to the first power supply node;
functional circuitry, powered by the voltage and configured to generate a signal using the voltage, the signal indicative of the input current being supplied to the input terminal; and an isolation circuit responsive to the signal to supply a representation of the signal across an isolation barrier to an isolation link.

2. The apparatus as recited in claim 1 wherein the input current is indicative of a control signal for a driver circuit electrically isolated from the input current by at least the isolation barrier.

3. The apparatus as recited in claim 1 further comprising:
a first unit comprising the first circuit, the functional circuitry and the isolation circuit;
a second unit comprising a receiver circuit and a high voltage driver circuit; and
wherein the first unit and the second unit are coupled by the isolation link, wherein the representation of the signal is provided to the second unit over the isolation link, the representation of the signal indicative of a control signal for the high voltage driver circuit.

4. The apparatus as recited in claim 1 wherein the isolation circuit includes a transformer and wherein the functional circuitry, when supplied with the voltage, is responsive to supply a signal into a primary winding of the transformer to cause energy to be coupled into a secondary winding of the transformer, the isolation barrier being disposed between the primary and secondary windings.

5. The apparatus as recited in claim 1 wherein when no current is supplied to the input terminal, substantially zero voltage is generated by the regulator circuit and the signal is not supplied by the functional circuitry.

6. The apparatus as recited in claim 1 wherein the first circuit is configured to be resistant to electrostatic discharge.

7. The apparatus as recited in claim 1 wherein the regulator circuit comprises:
first and second transistors serially connected at a first node, a gate of the first and second transistors connected to the first node, one of the first and second transistors being an N-channel transistor and one of the first and second transistors being a P-channel transistor, the first and second transistors coupled between the input terminal and a terminal coupled to supply an output current.

8. The apparatus as recited in claim 1 further comprising an integrated circuit having a two terminal interface, including the input terminal for receiving the input current and a second terminal coupled to the first circuit for supplying an output current, the integrated circuit further including the functional circuitry and the isolation circuit.

9. The apparatus as recited in claim 1 wherein the signal is an oscillating signal supplied while the input current is being supplied.

10. The apparatus as recited in claim 9 wherein the functional circuitry comprises an oscillator circuit configured to supply the signal.

11. The apparatus as recited in claim 1 wherein the regulator circuit includes a shunt voltage regulator configured to generate a substantially stable regulated voltage as the voltage.

12. The apparatus as recited in claim 1 wherein the voltage remains substantially stable over a large swing of the input current supplied to the input terminal.

13. The apparatus as recited in claim 1 further comprising:
a second terminal; and
a second power supply node coupled to the second terminal,
wherein the regulator circuit is coupled to the first power supply node and to the second power supply node, and wherein the first power supply node and second power supply node are power supply nodes of the functional circuit.

14. The apparatus as recited in claim 1 wherein the functional circuitry is coupled such that the voltage is the only voltage supplied to power the functional circuitry.

15. The apparatus as recited in claim 1 wherein the voltage is stable over a range of the input current extending between 5 mA and 15 mA.

16. The apparatus as recited in claim 1 wherein the regulator circuit is coupled in parallel to the functional circuitry between the first power supply node and an output terminal.

17. An apparatus comprising:
a first circuit including a regulator circuit configured to generate a voltage in response to an input current being supplied to an input terminal, the regulator circuit comprising first and second transistors serially connected at a first node, a gate of the first and second transistors connected to the first node, one of the first and second transistors being an N-channel transistor and one of the first and second transistors being a P-channel transistor, the first and second transistors coupled between the input terminal and a terminal coupled to supply an output current;
functional circuitry, powered by the generated voltage and configured to generate a signal using the generated voltage, the signal indicative of the input current being supplied to the apparatus;
an isolation circuit responsive to the signal to supply a representation of the signal across an isolation barrier to an isolation link;
a resistor coupled between one of the transistors at a second node and the output terminal;
a capacitor coupled between the input terminal and the second node; and
a third transistor coupled between the input node and the output node, the third transistor having a gate coupled to the second node.

18. A method comprising:
receiving an input current on an input terminal coupled to a power supply node;
generating on the power supply node by a regulator circuit a supply voltage for functional circuitry using the input current;
generating a signal in the functional circuitry indicative of presence of the input current using the supply voltage; and
supplying a representation of the signal across a voltage isolation barrier to an isolation link.

19. The method as recited in claim 18 further comprising:
transmitting the representation of the signal over the isolation link to a receiver circuit coupled to a high voltage driver circuit that is electrically isolated from the input current; and
generating a control signal for the high voltage driver circuit using the representation of the signal.

20. The method as recited in claim 18 wherein supplying the representation of the signal across the voltage isolation barrier comprises supplying the signal into a primary winding of a transformer to cause energy to be coupled into a secondary winding of the transformer, the primary and secondary windings being separated by the voltage isolation barrier.

21. The method as recited in claim 18 wherein the supply voltage is generated using two or more transistors configured as diodes.

22. The method as recited in claim 18 further comprising supplying the input current to first and second transistors serially connected at a first node, a gate of the first and second transistors connected to the first node, one of the first and second transistors being an N-channel transistor and one of the first and second transistors being a P-channel transistor, the first and second transistors coupled between a terminal to receive the input current and a terminal coupled to supply an output current.

23. The method as recited in claim 22 further comprising providing an electrostatic static discharge resistance as part of the regulator circuit.

24. The method as recited in claim 18 further comprising using an oscillator circuit powered by the voltage generated by the regulator circuit.

25. The method as recited in claim 24 further comprising supplying the voltage generated by the regulator circuit to an oscillator circuit used to generate the oscillating signal.

26. The method as recited in claim 18 wherein the signal is an oscillating signal.

27. The method as recited in claim 18 wherein supplying the representation of the signal across the voltage isolation barrier comprises supplying the signal to a capacitor, the capacitor implementing the voltage isolation barrier.

28. The method as recited in claim 18 further comprising:
electrically isolating the functional circuitry and the regulator circuit from a receiver circuit coupled to a high voltage driver circuit using a capacitor to capacitively couple the functional circuitry to the receiver circuit.

29. An apparatus comprising:
an input terminal for receiving an input current and an output terminal for supplying an output current;
means coupled between the input terminal and the output terminal for generating a voltage on a first node coupled to the input terminal when the input current is present;
means, powered by the voltage generated by the means coupled between the input terminal and the output terminal, for generating a signal while the input current is being received on the input terminal, the signal indicative of the input current; and
means for supplying the signal over an isolation link.

30. An apparatus comprising:
a first circuit including a regulator circuit configured to generate a voltage on a first node coupled to an input terminal in response to an input current being supplied to the first node via the input terminal; and
functional circuitry, coupled to the first node, the functional circuitry being powered by the voltage and configured to generate a signal in response to the voltage, the signal indicative of whether the input current is being supplied to the apparatus,
wherein the input current is indicative of a control signal for a driver circuit electrically isolated from the input current.

* * * * *